United States Patent
Liu

(10) Patent No.: US 9,412,421 B2
(45) Date of Patent: Aug. 9, 2016

(54) MEMORY ARRAYS

(71) Applicant: Micron Technology, Inc., Boise, ID (US)

(72) Inventor: Zengtao T. Liu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/937,994

(22) Filed: Jul. 9, 2013

(65) Prior Publication Data

US 2013/0294132 A1 Nov. 7, 2013

Related U.S. Application Data

(62) Division of application No. 13/607,681, filed on Sep. 8, 2012, now Pat. No. 8,488,374, which is a division of application No. 12/795,565, filed on Jun. 7, 2010, now Pat. No. 8,289,763.

(51) Int. Cl.
*G11C 11/00* (2006.01)
*G11C 5/02* (2006.01)
(Continued)

(52) U.S. Cl.
CPC .............. *G11C 5/025* (2013.01); *G11C 5/063* (2013.01); *G11C 7/1087* (2013.01); *G11C 7/1093* (2013.01); *G11C 8/14* (2013.01);
(Continued)

(58) Field of Classification Search
CPC ....................................................... G11C 11/00
USPC ............. 365/46, 94, 100, 113, 129, 148, 158, 365/163; 257/2–5, 296, E31.047, E27.006; 438/29, 95, 96, 166, 259, 365, 482, 438/486, 597; 977/754
See application file for complete search history.

(56) References Cited

U.S. PATENT DOCUMENTS

| 4,715,685 A | 12/1987 | Yaniv et al. |
| 4,964,080 A | 10/1990 | Tzeng |

(Continued)

FOREIGN PATENT DOCUMENTS

| CN | 1339159 | 3/2002 |
| CN | 1444284 | 9/2003 |

(Continued)

OTHER PUBLICATIONS

WO PCT/US2011/035601, Nov. 28, 2011, Search Report.
(Continued)

*Primary Examiner* — Harry W Byrne
(74) *Attorney, Agent, or Firm* — Wells St. John P.S.

(57) ABSTRACT

Some embodiments include memory arrays. The memory arrays can have global bitlines extending along a first horizontal direction, vertical local bitlines extending perpendicularly from the global bitlines, and wordlines extending along a second horizontal direction which is perpendicular to the first horizontal direction. The global bitlines may be subdivided into a first series at a first elevational level, and a second series at a second elevational level which is different from the first elevational level. The global bitlines of the first series can alternate with the global bitlines of the second series. There can be memory cell material directly between the wordlines and the vertical local bitlines. The memory cell material may form a plurality of memory cells uniquely addressed by wordline/global bitline combinations. Some embodiments include cross-point memory cell units that have areas of about $2F^2$.

14 Claims, 10 Drawing Sheets

(51) Int. Cl.
*G11C 5/06* (2006.01)
*G11C 8/14* (2006.01)
*G11C 13/00* (2006.01)
*G11C 7/10* (2006.01)

(52) U.S. Cl.
CPC ........ *G11C 13/0004* (2013.01); *G11C 13/0026* (2013.01); *G11C 2213/18* (2013.01); *G11C 2213/71* (2013.01); *G11C 2213/77* (2013.01)

(56) References Cited

U.S. PATENT DOCUMENTS

| | | |
|---|---|---|
| 5,049,970 A | 9/1991 | Tanaka et al. |
| 5,122,476 A | 6/1992 | Fazan et al. |
| 6,034,882 A | 3/2000 | Johnson et al. |
| 6,218,696 B1 | 4/2001 | Radius |
| 6,432,767 B2 | 8/2002 | Torii et al. |
| 6,524,867 B2 | 2/2003 | Yang et al. |
| 6,552,952 B2 | 4/2003 | Pascucci |
| 6,687,147 B2 | 2/2004 | Frickle et al. |
| 6,693,821 B2 | 2/2004 | Hsu et al. |
| 6,693,846 B2 | 2/2004 | Fibranz |
| 6,717,881 B2 | 4/2004 | Ooishi |
| 6,753,561 B1 | 6/2004 | Rinerson et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner et al. |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,950,369 B2 | 9/2005 | Kunikiyo et al. |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 6,985,374 B2 | 1/2006 | Yamamura |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,046,550 B1 | 5/2006 | Reohr et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,109,544 B2 | 9/2006 | Schloesser et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,459,715 B2 | 12/2008 | Toda et al. |
| 7,465,675 B2 | 12/2008 | Koh |
| 7,473,982 B2 | 1/2009 | Aono et al. |
| 7,489,552 B2 | 2/2009 | Kurotsichi et al. |
| 7,525,410 B2 | 4/2009 | Aono et al. |
| 7,538,338 B2 | 5/2009 | Rinerson et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,666,526 B2 | 2/2010 | Chen et al. |
| 7,671,417 B2 | 3/2010 | Yoshida et al. |
| 7,679,812 B2 | 3/2010 | Sasagawa et al. |
| 7,687,793 B2 | 3/2010 | Harshfield et al. |
| 7,687,840 B2 | 3/2010 | Shinmura |
| 7,696,077 B2 | 4/2010 | Liu |
| 7,700,935 B2 | 4/2010 | Kim et al. |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chlen et al. |
| 7,799,672 B2 | 9/2010 | Hashimoto et al. |
| 7,838,861 B2 | 11/2010 | Klostermann |
| 7,842,991 B2 | 11/2010 | Cho et al. |
| 7,864,568 B2 * | 1/2011 | Fujisaki et al. ............... 365/163 |
| 7,898,839 B2 | 3/2011 | Aoki |
| 7,907,436 B2 | 3/2011 | Maejima et al. |
| 7,910,909 B2 | 3/2011 | Kim et al. |
| 7,948,784 B2 | 5/2011 | Kajigaya |
| 7,952,914 B2 | 5/2011 | Baek et al. |
| 7,990,754 B2 | 8/2011 | Azuma et al. |
| 8,021,897 B2 | 9/2011 | Sills et al. |
| 8,043,926 B2 | 10/2011 | Cho et al. |
| 8,048,755 B2 | 11/2011 | Sandhu et al. |
| 8,094,477 B2 | 1/2012 | Maejima |
| 8,098,520 B2 | 1/2012 | Seigler et al. |
| 8,106,375 B2 | 1/2012 | Chen et al. |
| 8,114,468 B2 | 2/2012 | Sandhu et al. |
| 8,124,968 B2 | 2/2012 | Koo et al. |
| 8,154,908 B2 | 4/2012 | Maejima et al. |
| 8,154,909 B2 | 4/2012 | Azuma et al. |
| 8,295,077 B2 | 10/2012 | Murooka |
| 8,355,274 B2 | 1/2013 | Arita et al. |
| 8,411,477 B2 | 4/2013 | Tang et al. |
| 8,427,859 B2 | 4/2013 | Sandhu et al. |
| 8,431,458 B2 | 4/2013 | Sills et al. |
| 8,436,414 B2 | 5/2013 | Tanaka et al. |
| 8,536,556 B2 | 9/2013 | Fukuzimu |
| 8,537,592 B2 | 9/2013 | Liu |
| 8,542,513 B2 | 9/2013 | Tang et al. |
| 8,611,121 B2 | 12/2013 | Ahn et al. |
| 8,652,909 B2 | 2/2014 | Sills et al. |
| 8,743,589 B2 | 6/2014 | Sandhu et al. |
| 8,791,447 B2 | 7/2014 | Liu et al. |
| 8,854,863 B2 | 10/2014 | Liu |
| 2002/0018355 A1 | 2/2002 | Johnson et al. |
| 2002/0034117 A1 | 3/2002 | Okazawa |
| 2002/0079524 A1 | 6/2002 | Dennison |
| 2002/0196695 A1 | 12/2002 | Pascucci |
| 2003/0031047 A1 | 2/2003 | Anthony et al. |
| 2003/0086313 A1 | 5/2003 | Asao |
| 2003/0174042 A1 | 9/2003 | Aono et al. |
| 2003/0174570 A1 | 9/2003 | Oishi |
| 2003/0185049 A1 | 10/2003 | Fricke et al. |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0188714 A1 | 9/2004 | Scheuerlein et al. |
| 2004/0245547 A1 | 12/2004 | Stipe |
| 2005/0001257 A1 | 1/2005 | Schloesser et al. |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0174835 A1 | 8/2005 | Rinerson et al. |
| 2005/0205943 A1 | 9/2005 | Yamada |

(56) References Cited

U.S. PATENT DOCUMENTS

| | | |
|---|---|---|
| 2005/0243844 A1 | 11/2005 | Aono et al. |
| 2005/0250281 A1 | 11/2005 | Ufert et al. |
| 2005/0269646 A1 | 12/2005 | Yamada |
| 2005/0275003 A1 | 12/2005 | Shinmura |
| 2005/0287741 A1 | 12/2005 | Ding |
| 2006/0023498 A1 | 2/2006 | Asao |
| 2006/0035451 A1 | 2/2006 | Hsu |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1 | 9/2006 | Baek et al. |
| 2006/0258079 A1 | 11/2006 | Lung et al. |
| 2006/0258089 A1 | 11/2006 | Chung-Zen |
| 2006/0274593 A1 | 12/2006 | Kurotsuchi et al. |
| 2006/0284242 A1 | 12/2006 | Jo |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0034848 A1 | 2/2007 | Liu |
| 2007/0041235 A1 | 2/2007 | Inoue |
| 2007/0045615 A1 | 3/2007 | Cho et al. |
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0171706 A1 | 7/2007 | Fuji |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0036508 A1 | 2/2008 | Sakamoto et al. |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0106925 A1 | 5/2008 | Paz De Araujo et al. |
| 2008/0123390 A1 | 5/2008 | Kim et al. |
| 2008/0157257 A1 | 7/2008 | Bertin et al. |
| 2008/0175031 A1 | 7/2008 | Park et al. |
| 2008/0175032 A1 | 7/2008 | Tanaka et al. |
| 2008/0185571 A1 | 8/2008 | Happ et al. |
| 2008/0186687 A1 | 8/2008 | Hong et al. |
| 2008/0212361 A1 | 9/2008 | Bertin et al. |
| 2008/0232160 A1 | 9/2008 | Gopalakrishnan |
| 2008/0247219 A1 | 10/2008 | Choi et al. |
| 2008/0251779 A1 | 10/2008 | Kakoschke et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya |
| 2009/0072217 A1 | 3/2009 | Klostermann |
| 2009/0085121 A1 | 4/2009 | Park et al. |
| 2009/0097295 A1 | 4/2009 | Morimoto |
| 2009/0141547 A1 | 6/2009 | Jin et al. |
| 2009/0168495 A1 | 7/2009 | Aoki |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling |
| 2009/0218557 A1 | 9/2009 | Sato |
| 2009/0250661 A1 | 10/2009 | Stevenson et al. |
| 2009/0261314 A1 | 10/2009 | Kim et al. |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0321878 A1 | 12/2009 | Koo et al. |
| 2009/0323385 A1 | 12/2009 | Scheuerlein et al. |
| 2010/0003782 A1 | 1/2010 | Sinha et al. |
| 2010/0008163 A1 | 1/2010 | Liu |
| 2010/0044666 A1 | 2/2010 | Baek et al. |
| 2010/0046273 A1 | 2/2010 | Azuma |
| 2010/0061132 A1 * | 3/2010 | Fujisaki et al. ................. 365/51 |
| 2010/0065836 A1 | 3/2010 | Lee et al. |
| 2010/0072452 A1 | 3/2010 | Kim et al. |
| 2010/0084741 A1 | 4/2010 | Andres et al. |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0172171 A1 | 7/2010 | Azuma et al. |
| 2010/0176368 A1 | 7/2010 | Ko et al. |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243983 A1 | 9/2010 | Chiang et al. |
| 2010/0258782 A1 | 10/2010 | Kuse et al. |
| 2010/0259960 A1 | 10/2010 | Samachisa |
| 2010/0259961 A1 | 10/2010 | Fasoli et al. |
| 2010/0259962 A1 | 10/2010 | Yan et al. |
| 2011/0059576 A1 | 3/2011 | Cho et al. |

(56) References Cited

U.S. PATENT DOCUMENTS

| | | | |
|---|---|---|---|
| 2011/0128775 A1 | 6/2011 | Maejima et al. | |
| 2011/0171836 A1 | 7/2011 | Xia | |
| 2011/0193044 A1 | 8/2011 | Sandhu et al. | |
| 2011/0205783 A1 | 8/2011 | Murooka | |
| 2011/0249486 A1 | 10/2011 | Azuma et al. | |
| 2011/0261606 A1* | 10/2011 | Sandhu et al. | 365/148 |
| 2011/0261607 A1* | 10/2011 | Tang et al. | 365/148 |
| 2011/0309322 A1 | 12/2011 | Hwang | |
| 2012/0119180 A1 | 5/2012 | Koo et al. | |
| 2012/0140542 A1 | 6/2012 | Liu | |
| 2012/0147648 A1 | 6/2012 | Scheuerlein | |
| 2012/0164798 A1 | 6/2012 | Sills et al. | |
| 2012/0187363 A1 | 7/2012 | Liu et al. | |
| 2012/0248399 A1 | 10/2012 | Sasago et al. | |
| 2013/0021836 A1 | 1/2013 | Liu | |
| 2014/0247640 A1 | 9/2014 | Liu | |

FOREIGN PATENT DOCUMENTS

| | | |
|---|---|---|
| CN | 101256831 | 9/2003 |
| CN | 1459792 | 12/2003 |
| CN | 1624803 | 6/2005 |
| CN | 101005113 | 12/2006 |
| CN | 101051670 | 4/2007 |
| CN | 101034732 | 9/2007 |
| CN | 101350360 | 1/2009 |
| CN | 101546602 | 9/2009 |
| CN | 101840995 | 9/2010 |
| CN | 200880124714.6 | 7/2012 |
| CN | 201180027954.6 | 5/2014 |
| EP | 1796103 | 9/2006 |
| EP | 11792836 | 12/2013 |
| EP | 11834802 | 3/2014 |
| EP | 11845727.4 | 11/2014 |
| EP | 14171745 | 3/2015 |
| GB | 1266513 | 3/1972 |
| JP | 2005175457 | 6/2005 |
| JP | 2005-353779 | 12/2005 |
| JP | 2006032729 | 2/2006 |
| JP | 2006040981 | 2/2006 |
| JP | 2006074028 | 3/2006 |
| JP | 2006121044 | 5/2006 |
| JP | 2008-135744 | 6/2008 |
| JP | 2008-192995 | 8/2008 |
| JP | 2009-081251 | 4/2009 |
| JP | 2009-163867 | 7/2009 |
| JP | 2009/267411 | 11/2009 |
| JP | 2010-009669 | 1/2010 |
| JP | 2010-010688 | 1/2010 |
| JP | 2010-192569 | 9/2010 |
| JP | 2010-192646 | 9/2010 |
| JP | 2010-232214 | 10/2010 |
| JP | 2010-263211 | 11/2010 |
| KR | 2003-0048421 | 6/2003 |
| KR | 2005-0008353 | 1/2005 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | WO 2010/068221 | 6/2010 |
| KR | 20100078808 | 7/2010 |
| KR | 20100083402 | 7/2010 |
| TW | 097147549 | 5/2013 |
| TW | 100119681 SR | 8/2013 |
| TW | 100135681 SR | 10/2013 |
| TW | 100142963 | 8/2014 |
| TW | 101102280 | 8/2014 |
| WO | WO 2006/003620 | 1/2006 |
| WO | WO 2008/029446 | 3/2008 |
| WO | WO 2009/127187 | 10/2009 |
| WO | WO 2010/068221 | 6/2010 |
| WO | WO 2010/082922 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | WO 2010/101340 | 9/2010 |
| WO | WO 2010/117911 | 10/2010 |

OTHER PUBLICATIONS

WO PCT/US2011/035601, Nov. 28, 2011, Written Opinion.
WO PCT/US2011/035601, Dec. 10, 2012, IPRP.
Yoon, Hong Sik et al., "Vertical Cross-point Resistance Change Memory for Ultra-High Density Non-volatile Memory Applications" 2009 Symposium on VLSI Technology Digest of Technical Papers, pp. 26-27.
WO PCT/US2011/066770 IPRP, Jul. 23, 2013, Micron Technology, Inc.
U.S. Appl. No. 12/701,885, filed Feb. 8, 2010, Sandhu et al.
U.S. Appl. No. 12/765,598, filed Apr. 22, 2010, Sandhu et al.
U.S. Appl. No. 12/959,015, filed Dec. 2, 2010, Liu.
U.S. Appl. No. 12/979,189, filed Dec. 27, 2010, Sills et al.
U.S. Appl. No. 13/010,048, filed Jan. 20, 2010, Liu et al.
WO PCT/US2008/084422, Mar. 19, 2009, Search Report/Written Opinion.
WO PCT/US2008/084422, Jul. 22, 2010, IPRP.
WO PCT/US2011/051785, Apr. 10, 2012, Search Report/Written Opinion.
WO PCT/US2011/051785, Apr. 23, 2013, IPRP.
U.S. Appl. No. 12/014,232, filed Jan. 15, 2008, Liu.
U.S. Appl. No. 12/099,267, filed Apr. 8, 2008, Smythe et al.
U.S. Appl. No. 12/114,096, filed May 2, 2008, Srinivasan et al.
U.S. Appl. No. 12/141,388, filed Jun. 18, 2008, Liu.
U.S. Appl. No. 12/141,559, filed Jun. 18, 2008, Sandhu et al.
U.S. Appl. No. 12/166,604, filed Jul. 2, 2008, Sinha et al.
U.S. Appl. No. 12/765,506, filed Apr. 22, 2010, Tang et al.
Baek et al, "Multi-Layer cross-point Binary Oxide resistive Memory (OxRRAM) for Post-NAND Storage Application", IEEE, 2005.
Bedeschi et al., "A Bipolar-Selected Phase Change Memory Featuring Multi-Level Cell Storage", IEEE, vol. 44, No. 1, Jan. 2009, pp. 217-227.
Chen et al., "Non-Volatile Resistive Switching for Advanced Memory Applications", IEEE, 2005, 4 pages.
Chen et al., Peroskite RRAM Devices with Metal/Insulator/PCMO/Metal Heterostructures, 2005; pp. 125-128.
Courtade et al., "Microstructure and resistance switching in NiO binary oxide films obtained from Ni oxidation", IEEE, 2006, pp. 94-99.
Higaki et al.; Effects of Gas Phase Absorption into Si Substrates on Plasma doping Process; Jan. 2004; A208.
Ho et al., "A Highly Reliable Self-=Aligned Graded Oxide WOx Resistance Memory: Conduction Mechanisms and Reliability", 2007 Symposium on VLSI Technology Digest of Technical Papers, pp. 228-229.
Hosoi et al., "High Speed Unipolar Switching Resistance RAM (RRAM) Technology", Advanced Materials Res. Lab, Japan; Correlated Electron Res. Center (CERC), Japan; Nanotechnology Res. Inst. (NRI), Japan, Dec. 2006; 4 pp.
Hudgens et al., "Overview of Phase-Change Chaicogenide Nonvolatile Memory Technology", MRS Bulletin, Nov. 2004, pp. 829-832.
Ignatiev et al., "Resistance Non-volatile Memory-RRAM" Mater. Res, Soc. Symp. Proc., vol. 997, 2007, Materials Research Society, 9 pages.
Karg et al., "Nanoscale REsistive Memory Device using SiRiO3 Films", IEEE, 2007, pp. 68-70.
Kau et al., "A Stackable cross point phase change memory", IEEE, 2009, pp, 27.1.1-27.1.4.
Komori et al., Disturbless flash memory due to high boosi efficiency on BiCS structure and optimal memory film stack for ultra high density storage device; Dec. 2008; pp. 851-854.
Kooij et al., "Photoselective Metal Deposition on Amorphous Silicon p-i-n Solar Cells", Electrochemical Society Letters, Journal of Electrochemical Society vol. 44, No. 10, Oct. 1997, pp. L271-L272.

(56) References Cited

OTHER PUBLICATIONS

Kozickl el el., "Non-Volatile Memory Based on Solid Electrolytes", Center for Solid State Electronics Research, Arizona State University, Nov. 2004; 8 pp.

Kozicki, "Memory Devices Based on Solid Electrolytes", Mater. Res. Soc. Symp. Proc., vol. 997, 2007, Materials Research Society, 10 pages.

Lee et al., "2-stack 1D-1R Cross-Point Structure with Oxide Diodes as Switch Elements for High Density Resistance RAM Applications", IEE, 2007, pp. 771-774.

Lee et al., "Resistance Switching of Al doped ZnO for Non-Volatile Memory Applications", Dept. of Materials Science and Engineering, Gwangju Institute of Science and Technology, May 2006; 2 pp.

Lin et al., "Effect of Top Electrode Material on REsistive Switching Properties of ZrO2 Film Memory Devices", IEEE, May 2007, vol. 28, No. 5, pp. 366-368.

Meyer et al., "Oxide Dual-Layer Memory Element for Scalable Non-Volatile Cross-Point Memory Technology", IEEE, 2008, 5 pages.

Miyashita et al., "A Novel Bit Line Process using Poly-Si Masked Dual-Damascene (PMDD) for 0.13.um DRAMs and Beyond", IEEE, 2000, pp. 15.4.1-15.4.4.

Muller et al., "Emerging Non-Volatile Memory Technologies", IEEE, 2003, pp. 37-44.

Oh, "Full Integration of Highly Manufacturable 512Mb PRAM based on 90nm Technology" 2006, IEEE, 4 pages.

Pein et al., "Performance of the 3-D Pencil Flash EPROM Cell and Memory Array", IEEE, 1995, pp. 1982-1991.

Pellizzer et al., "A 90nm Phase Change Memory Technology for Stand-Alone Non Volatile Memory Applications", IEEE, 2006, Symposium on VLSI Technology Digest of Technical Papers, 2 pages.

Plrovano et al., "Self-Aligned u Trench Phase-Change Memory Cell Architecture for 90nm Technology and Beyond", IEEE, 2007, pp. 222-225.

Programmable metallization cell, Dec. 11, 2007; http://en.wikipedia.org/wiki/Programmable_metallization_cell on Dec. 13, 2011.

Scheck at al., "Selective Metal Electrodeposition Through Doping Modulation of Semiconductor Surfaces", Applied Physics Letters 86, 2005, 3 pgs.

Wikipedia, Despotuli et al., "Programmable Metallization Cell", pp. 1-4, Dec. 11, 2007, Place of Publication: Internet.

Wuttig, "Towards a Universal Memory?", Nature Materials, vol. 4, Apr. 2005, pp. 265-266.

Xing et al., "Characterization of AlGaN/GaN p-n Diodes with Selectively Regrown n-AlGaN by Metal-Organic Chemical-Vapor Deposition and its Application to GaN-Based Bipolar Transistors", Journal of Alipied Physics 97, 2005, 4 pgs.

Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.

Yu et al., "Structure Effects on Resistive Switching of Al/TiOx/Al Devices for RRAM Applications", IEEE, 2008, pp. 331-333.

WO PCT/US12/021168, Search Rep., Jul. 24, 2012, Micron Technology, Inc.

WO PCT/US 12/021168 Written Op., Jul. 24, 2012, Micron Technology, Inc.

Choi et al., "Defect Structure and Electrical Properties of Single-Crystal Ba0.03SR0.97TiO3", J. Am. Ceram. Soc., 71, [4], pp. 201-205, 1988.

WO PCT/US2011/059095, May 21, 2012, Search Report/Written Opinion.

WO PCT/US2011/059095, Jun. 4, 2013, IPRP.

WO PCT/US2011/066770, Sep. 11, 2012, Search Report/Written Opinion.

CN 2011800650428 Srch Rpt., May 22, 2015, Micron Technology, Inc.

CN 2011800578660 SrchRpt.-Transl., Nov. 25, 2015, Micron Technology, Inc.

\* cited by examiner

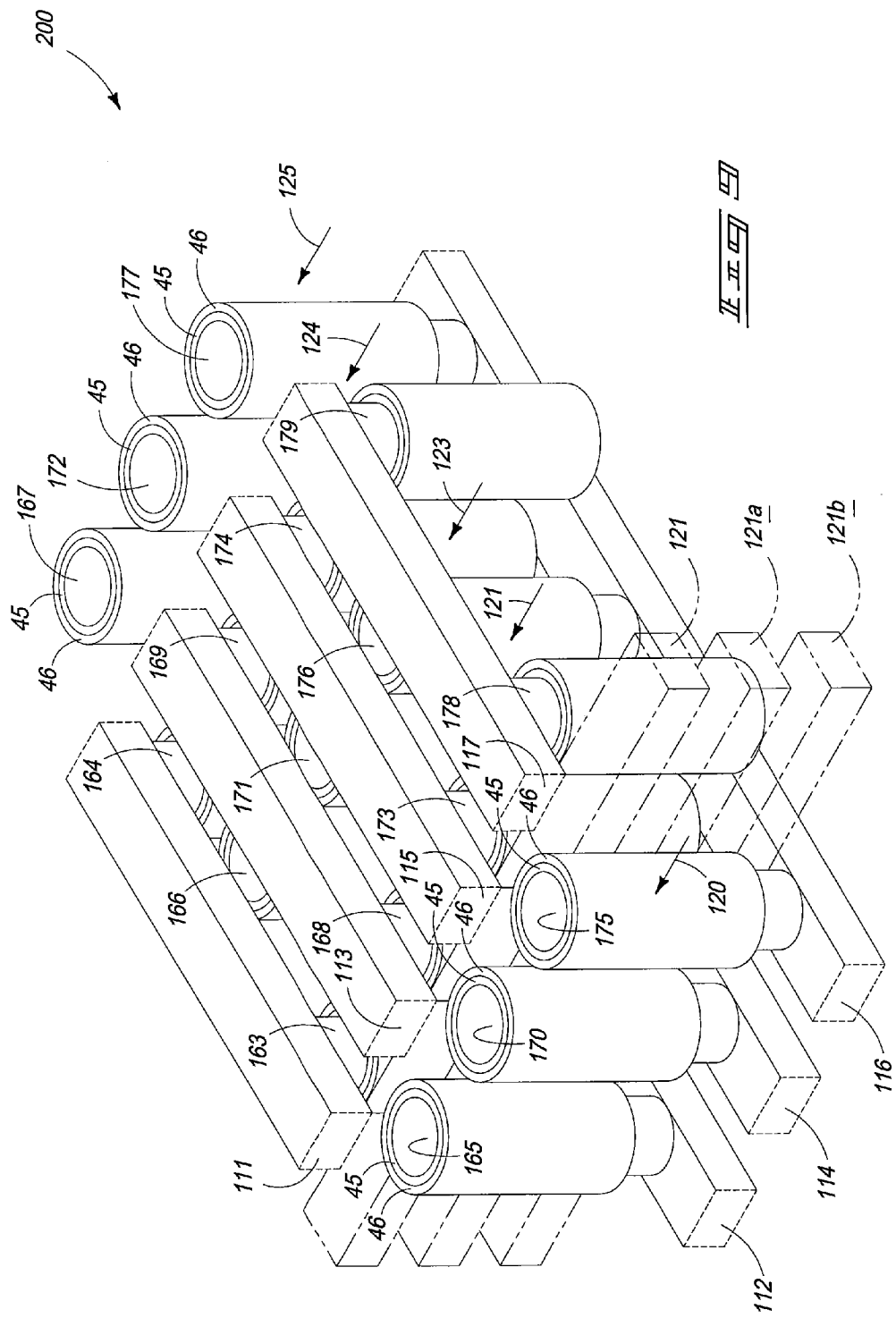

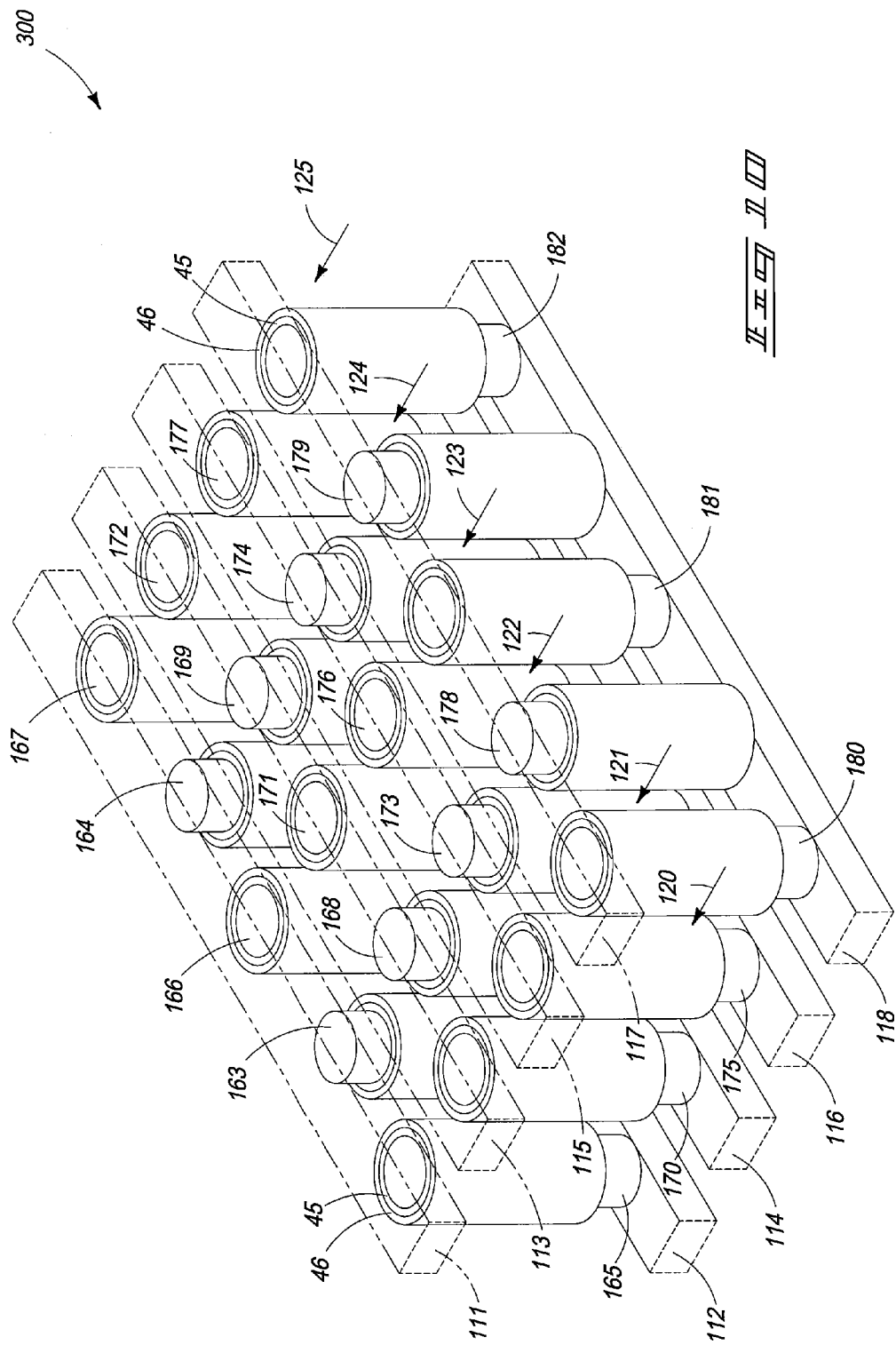

MEMORY ARRAYS

RELATED PATENT DATA

This patent resulted from a divisional of U.S. patent application Ser. No. 13/607,681, which was filed Sep. 8, 2012, and which is hereby incorporated herein by reference; which resulted from a divisional of U.S. patent application Ser. No. 12/795,565, which was filed Jun. 7, 2010, which issued as U.S. Pat. No. 8,289,763, and which is hereby incorporated herein by reference.

TECHNICAL FIELD

Memory arrays.

BACKGROUND

Memory arrays are utilized for tightly packing memory cells within integrated circuitry. One type of memory which is particularly amenable to tight packing is cross-point memory.

A memory array may comprise a plurality of wordlines extending along a first direction, and a plurality of bitlines extending orthogonally to the wordlines. Cross-point memory may utilize memory cell material formed at the intersections of the bitlines and wordlines across the array. The memory cell material may be phase change material, such as chalcogenides. Example chalcogenides are alloys of germanium, antimony and tellurium.

In addition to the memory cell material, the individual memory cells may also comprise access devices which limit current to the memory cell material until a voltage differential across the memory cell material and the access device reaches a predetermined threshold. The access devices may be non-linear electronic devices. Specifically, the access devices may be electronic devices which are in a highly resistive state until a voltage differential reaches a predetermined value, whereupon the electronic devices transform to a conducting state. Example access devices are diodes and ovonic threshold switches.

An example prior art cross-point memory array 5 is shown in FIGS. 1-3; with FIG. 1 being a top view, and with FIGS. 2 and 3 being cross-sectional side views. The cross-sectional views of FIGS. 2 and 3, like all other cross-sectional views in this disclosure, only show features within the planes of the cross-sections. The cross-sectional views do not show materials behind the planes of the cross-sections in order to simplify the drawings.

The top view of FIG. 1 shows that the memory array comprises a plurality of global bitlines 10-14 that extend along a first horizontal direction, and comprises a plurality of wordlines 20-25 that extend orthogonally to the global bitlines. The cross-sectional side view of FIG. 2 shows that the wordlines of FIG. 1 are actually the top series of a stack of wordlines, with FIG. 2 showing two underlying series of wordlines. The wordlines within one of the underlying series are labeled as wordlines 20a-25a, and the wordlines in the other of the underlying series are labeled as wordlines 20b-25b.

Eighteen wordlines (20-25, 20a-25a and 20b-25b) are shown in the cross-sectional view of FIG. 2. The eighteen wordlines form a two-dimensional wordline array having columns of three wordlines, and rows of six wordlines.

FIGS. 1-3 show that vertical bitline pillars 30-44 extend upwardly from the global bitlines. The bitline pillars extend through the wordline array, and are between some of the columns of such wordline array. The wordlines, bitlines and vertical bitline pillars comprise electrically conductive material, such as, for example, one or more of various metals, metal-containing compositions, and conductively-doped semiconductor materials.

Memory cell material 45 (only some of which is labeled) is provided between the wordlines and vertical bitline pillars; and access devices 46 (only some of which are labeled) are provided between the wordlines and the vertical bitline pillars. The memory cell material and access device provided between a wordline and a vertical bitline pillar together form a memory cell 47 (only some of which are labeled).

Although the memory cell material is shown to be a single homogeneous composition, it may comprise multiple discrete compositions in some applications. Also, although the access devices are shown to comprise single, homogeneous compositions, the access devices may comprise numerous discrete compositions; and often do comprise two or more different materials. Further, although only a single access device is shown in each memory cell, there can be multiple access devices in the individual memory cells. Also, although the memory cell material is shown directly adjacent the vertical bitline pillars, and the access devices are shown directly adjacent the wordlines, the relative orientations of the memory cell material and the access devices may be reversed.

In operation, each individual memory cell may be uniquely addressed by a combination of a global bitline and a wordline. For instance, a voltage differential between global bitline 12 and wordline 20 may be utilized to access the memory cell located at the intersection where wordline 20 crosses vertical bitline pillar 36. Such access may be utilized for writing to the memory cell by placing the memory cell in a specific data storage state, and for reading from the memory cell by ascertaining which data storage state the memory cell is in.

The wordlines within the two-dimensional wordline array of FIG. 2 may be considered to be arranged in a plurality of elevational planes 50-52, and accordingly the top view of FIG. 1 may be considered to be showing the uppermost elevational plane 52 of the wordline array. The memory array may be considered to also comprise the elevational planes 50-52, and each memory unit of the memory array may be considered to have an area along the elevational plane containing such memory unit. The area may be stated in terms of a minimum feature size, F, utilized to form the memory array. Such minimum feature size will be the widths of the bitlines, the widths of the wordlines, the widths of the vertical bitline pillars, and the widths of the spaces between the bitlines and the wordlines if the memory array is fabricated to its absolute minimum dimensions.

The top view of FIG. 1 shows a square perimeter around one of the memory units. Such perimeter has sides that are of dimension 2F, and accordingly the memory unit has an area along elevational plane 52 of about $4F^2$. The area is referred to as being "about $4F^2$," rather than as being absolutely $4F^2$ because the illustrated perimeter assumes that the memory cell material 45 and access device 46 are of negligible size. Since the memory cell material 45 and access device 46 have some physical dimension, the planar area of the memory unit cell will approach $4F^2$, but will not be $4F^2$ in an absolute mathematical sense. Alternatively, the planar area of each memory cell unit may be considered to be $4F^2$ in a context in which the memory cell material and access device are ignored; or in other words may be considered to be $4F^2$ relative to the wordlines, bitlines and spaces consumed by each memory cell unit.

BRIEF DESCRIPTION OF THE DRAWINGS

Figure 1:
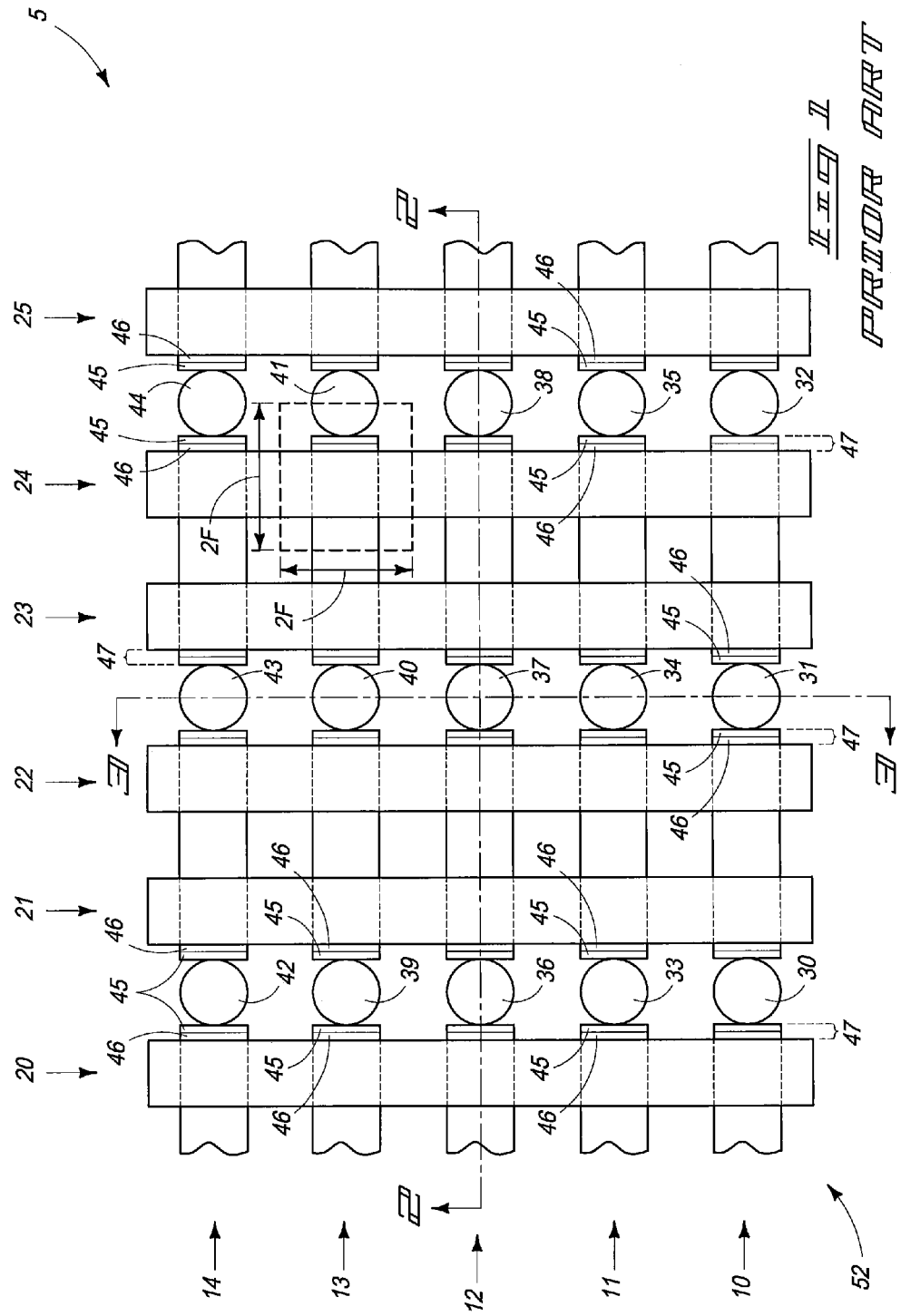
FIGS. 1-3 are diagrammatic views of a portion of a prior art memory array.

FIG. 1 is a top view of the array, and FIGS. 2 and 3 are diagrammatic cross-sectional side views along the lines 2-2 and 3-3, respectively, of FIG. 1.

Figure 4:
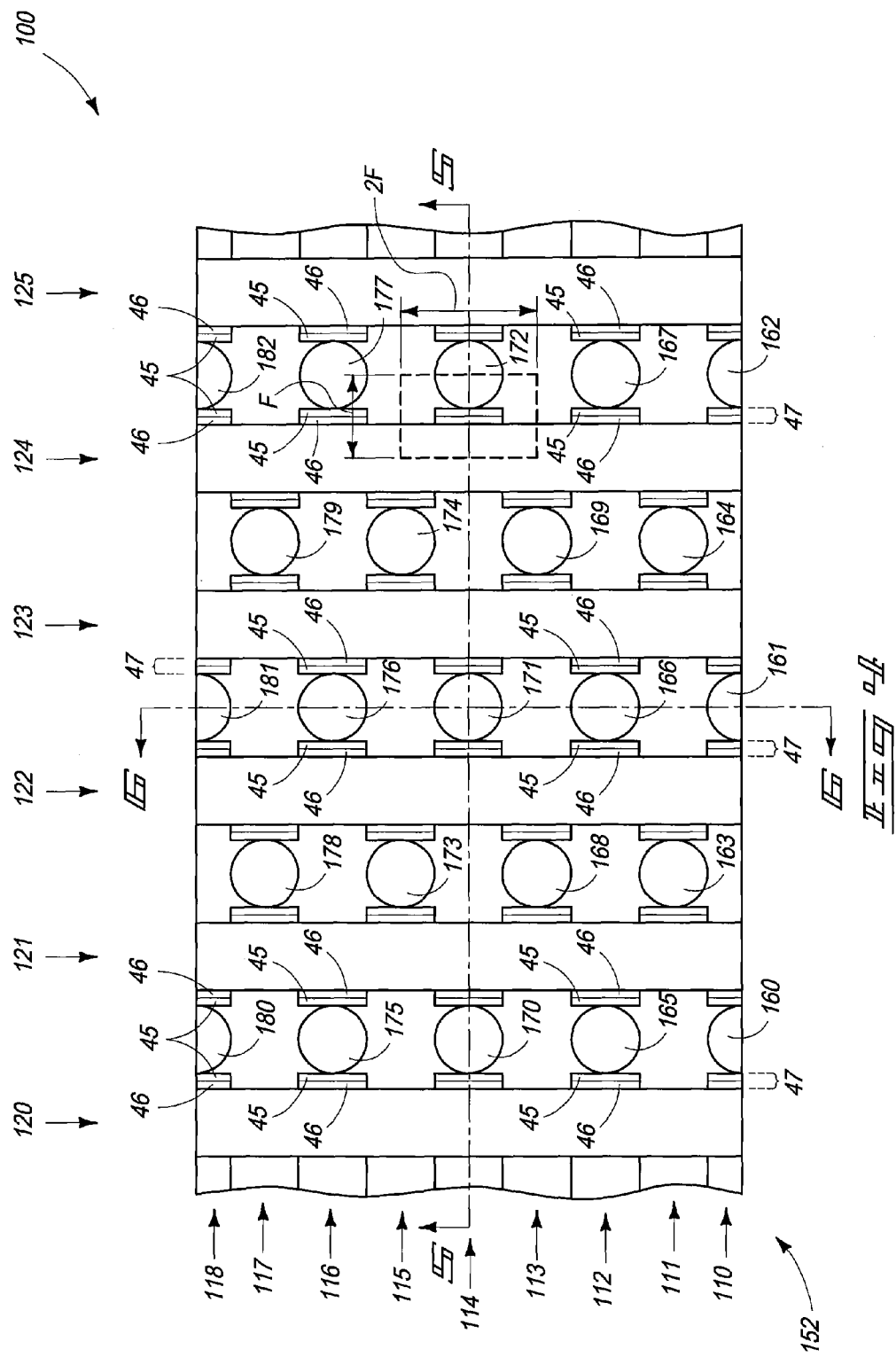
Figure 5:
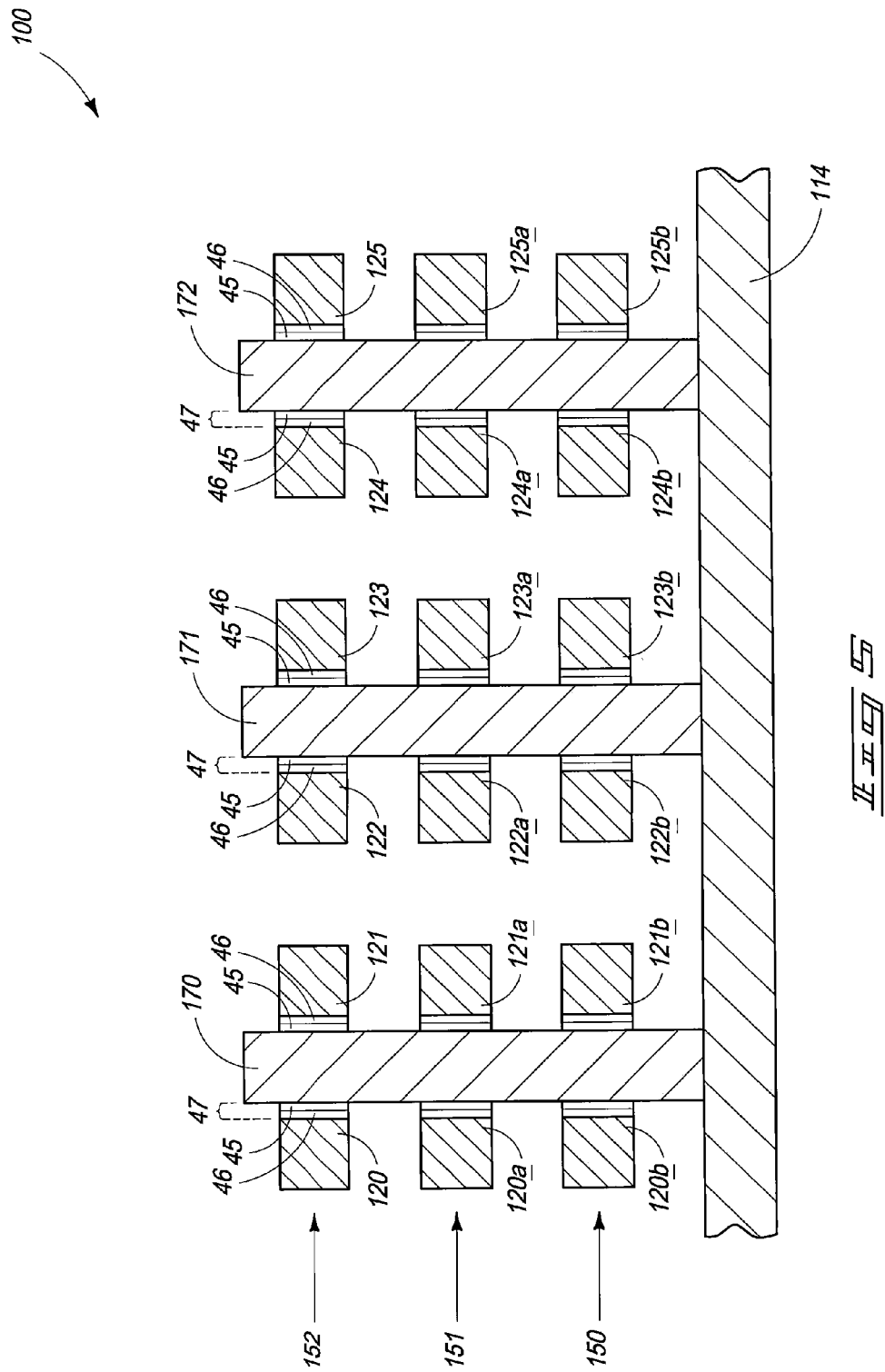
Figure 6:
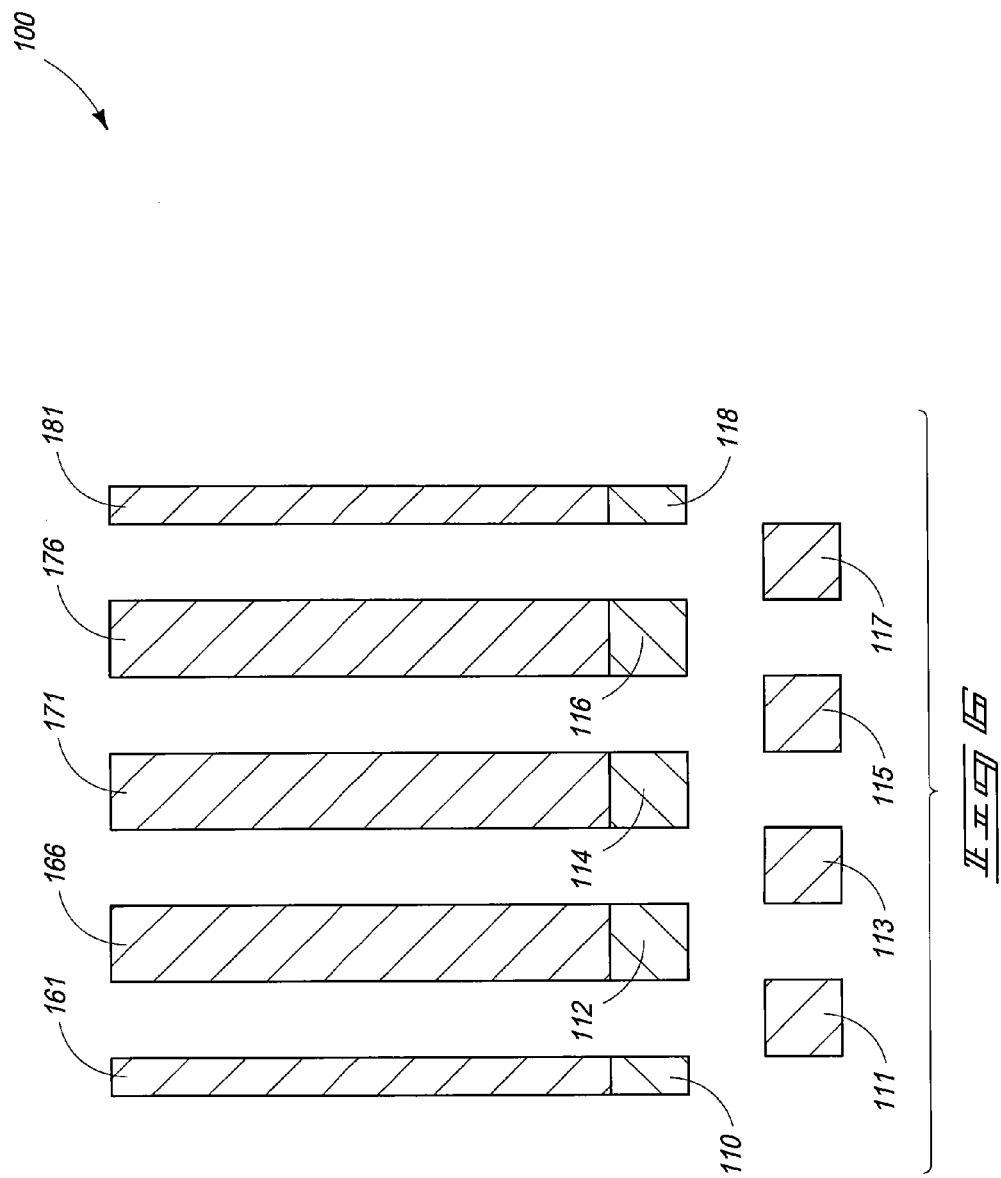

FIGS. 4-6 are diagrammatic views of a portion of an example embodiment memory array. FIG. 4 is a top view of the array, and FIGS. 5 and 6 are diagrammatic cross-sectional side views along the lines 5-5 and 6-6, respectively, of FIG. 4.

Figure 7:
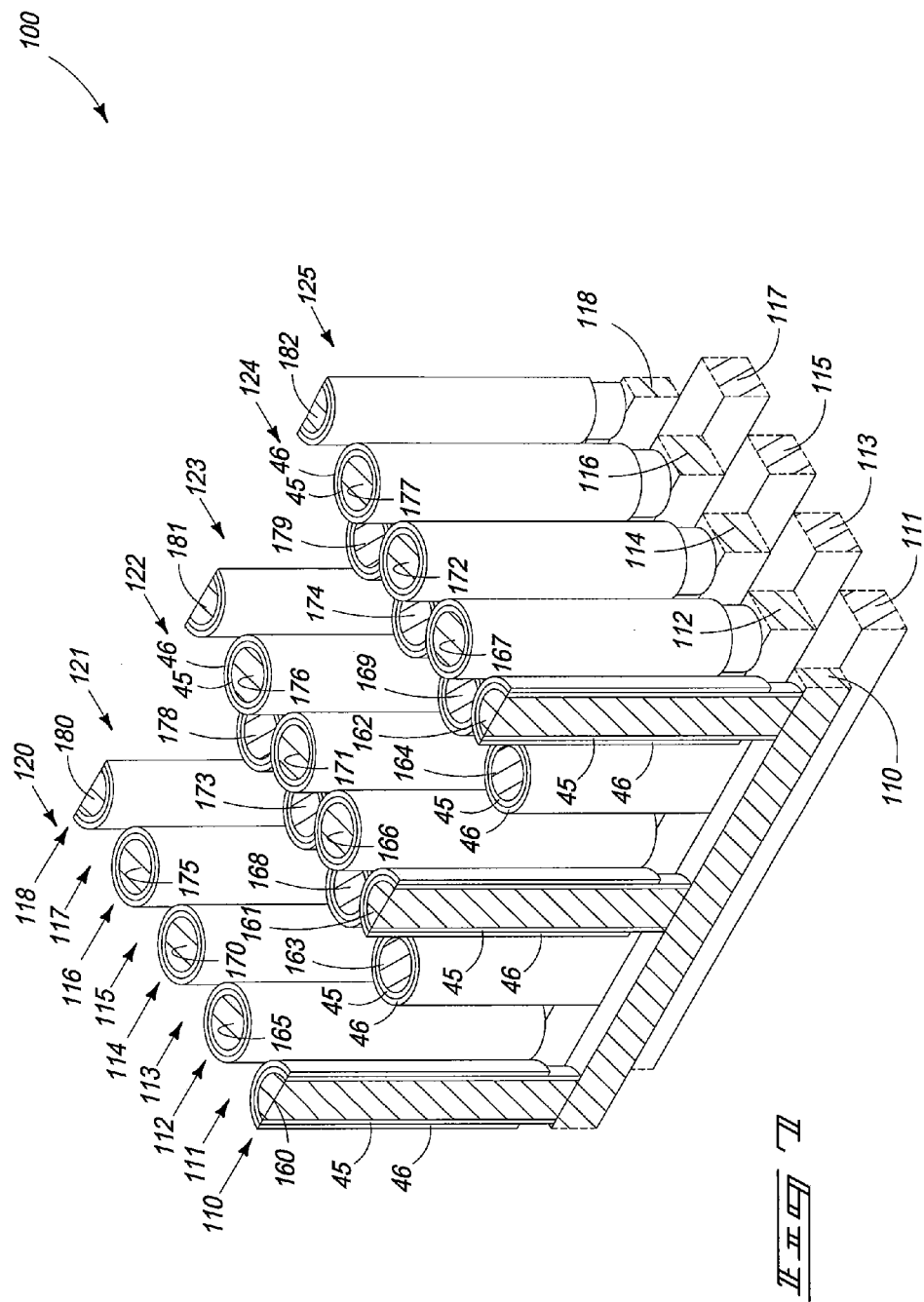

FIG. 7 is a three-dimensional view of a memory array similar to that of FIGS. 4-6.

Figure 8:
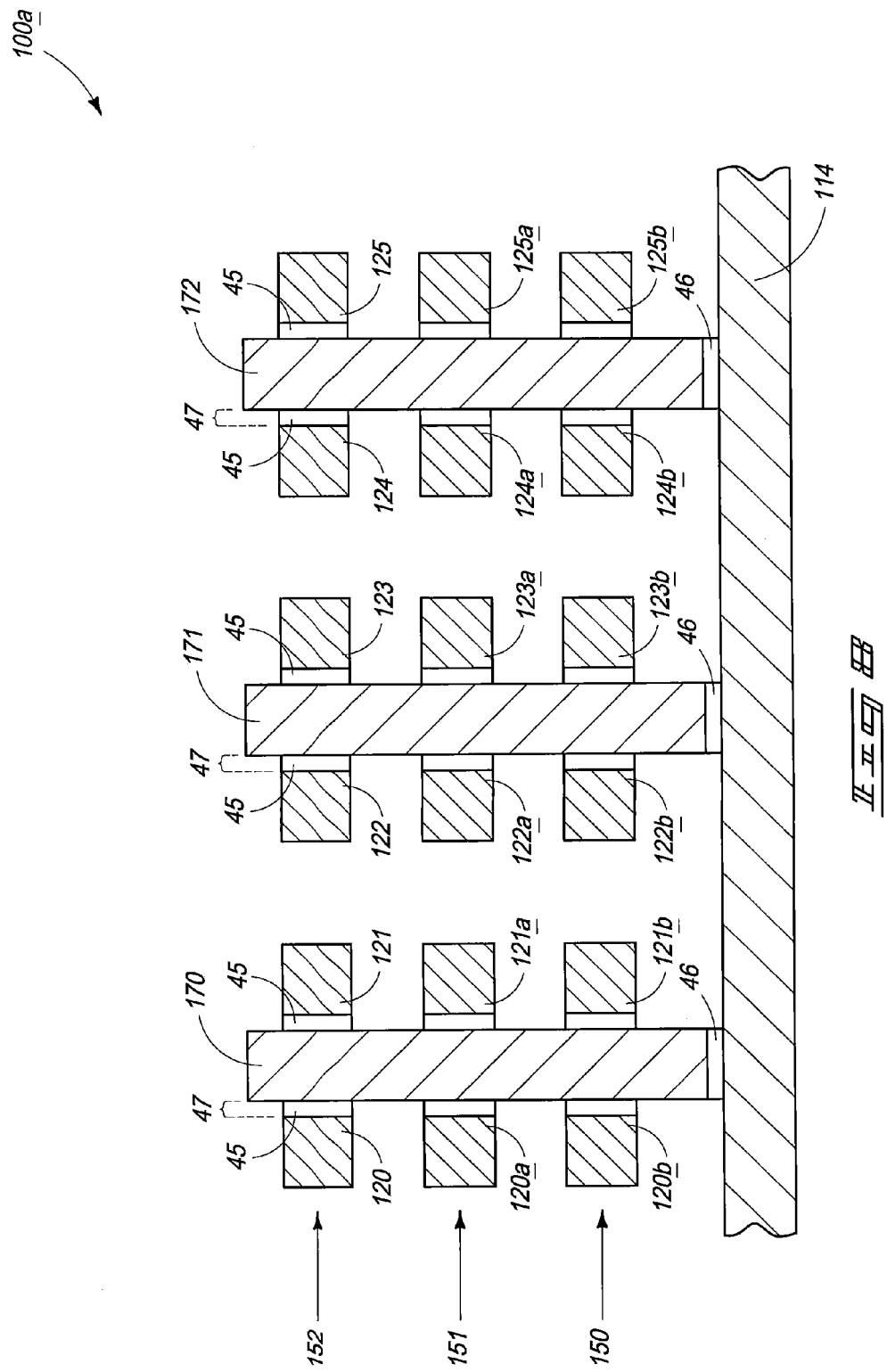

FIG. 8 is a diagrammatic cross-sectional view similar to that of FIG. 5, and shows another example embodiment memory array.

FIG. 9 is a three-dimensional view of another example embodiment memory array.

FIG. 10 is a three-dimensional view of another example embodiment memory array.

DETAILED DESCRIPTION OF THE ILLUSTRATED EMBODIMENTS

Some embodiments include new memory arrays in which cross-point memory cells may be more tightly packed than is achieved with conventional memory arrays. Example embodiments are described with reference to FIGS. 4-10.

An example embodiment memory array 100 is shown in FIGS. 4-6. The top view of FIG. 4 shows that the memory array 100 comprises a plurality of global bitlines 110-118 that extend along a first horizontal direction, and comprises a plurality of wordlines 120-125 that extend orthogonally to the global bitlines. The cross-sectional side view of FIG. 5 shows that the wordlines of FIG. 4 are actually the top series of a stack of wordlines, with FIG. 5 showing two underlying series of wordlines; with the wordlines within one of the series being labeled as wordlines 120a-125a, and with the wordlines in the other series being labeled as wordlines 120b-125b. Accordingly, eighteen wordlines are shown in the cross-sectional view of FIG. 5. The eighteen wordlines form a two-dimensional wordline array having columns of three wordlines, and rows of six wordlines. The two-dimensional wordline array is one example of a diversity of different two-dimensional wordline arrays. Such wordline arrays will generally have at least two wordlines in each row of the array, and at least two wordlines in each column of the arrays.

FIGS. 4-6 show that vertical bitline pillars 160-182 extend upwardly from the global bitlines. The bitline pillars extend through the wordline array, and are between adjacent columns of such wordline array. The wordlines, bitlines and vertical bitline pillars comprise electrically conductive material, such as, for example, one or more of various metals, metal-containing compositions, and conductively-doped semiconductor materials.

Memory cell material 45 (only some of which is labeled) is provided between the wordlines and vertical bitline pillars; and access devices 46 (only some of which are labeled) are provided between the wordlines and the vertical bitline pillars. The memory cell material and access device provided between a wordline and a vertical bitline pillar together form a memory cell 47 (only some of which are labeled). The memory cell material 45 and access devices 46 of the example embodiment of FIGS. 4-6 may be the same as the memory cell material 45 and access devices 46 of the prior art described above in the "Background" section.

Although the memory cell material is shown to be a single homogeneous composition, it may comprise multiple discrete compositions in some applications. Also, although the access devices are shown to comprise single, homogeneous compositions, the access devices may comprise numerous discrete compositions; and often do comprise two or more different materials. Further, although only a single access device is shown in each memory cell, there may be multiple access devices in the individual memory cells. Also, although the memory cell material is shown adjacent the vertical bitline pillar, and the access device is shown adjacent the wordline, the relative orientations of the memory cell material and the access device may be reversed.

The cross-sectional view of FIG. 6 shows that some of the global bitlines 110-118 are formed at a different elevational level than others of the global bitlines. Specifically, the global bitlines include a first series containing bitlines 110, 112, 114, 116 and 118 that is formed at one elevational level, and a second series containing bitlines 111, 113, 115 and 117 that is formed at a different elevational level. The global bitlines of the first series alternate with those of the second series, as shown in FIG. 6.

In operation, each individual memory cell may be uniquely addressed by a combination of a global bitline and a wordline. For instance, a voltage differential between global bitline 116 and wordline 121 may be utilized to access the memory cell located at the intersection where wordline 121 crosses vertical bitline pillar 175. Such access may be utilized for writing to the memory cell by placing the memory cell in a specific data storage state, and for reading from the memory cell by ascertaining which data storage state the memory cell is in.

The wordlines within the two-dimensional wordline array of FIG. 5 may be considered to be arranged in a plurality of elevational planes 150-152, and accordingly the top view of FIG. 4 may be considered to be showing the uppermost elevational plane 152 of the wordline array. The memory array may be considered to also comprise the elevational planes 150-152, and each memory unit of the memory array may be considered to have an area along the elevational plane containing such memory unit. The area may be stated in terms of the minimum feature size, F, utilized to form the memory array. Such minimum feature size will be the widths of the bitlines, the widths of the wordlines, the widths of the vertical bitline pillars, and the widths of the spaces between the bitlines and wordlines if the memory array is fabricated to its absolute minimum dimensions.

Figure 2:
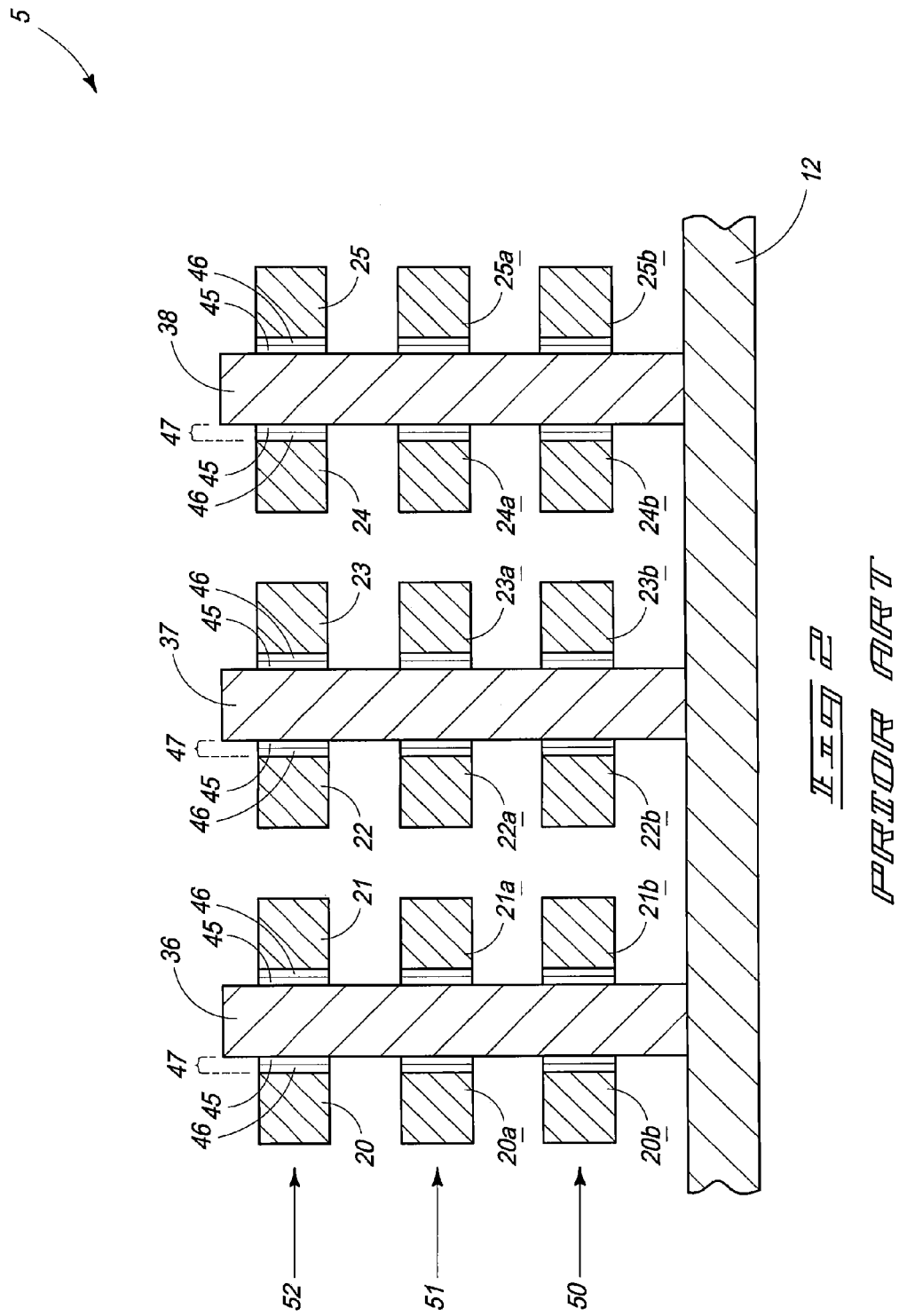
Figure 3:
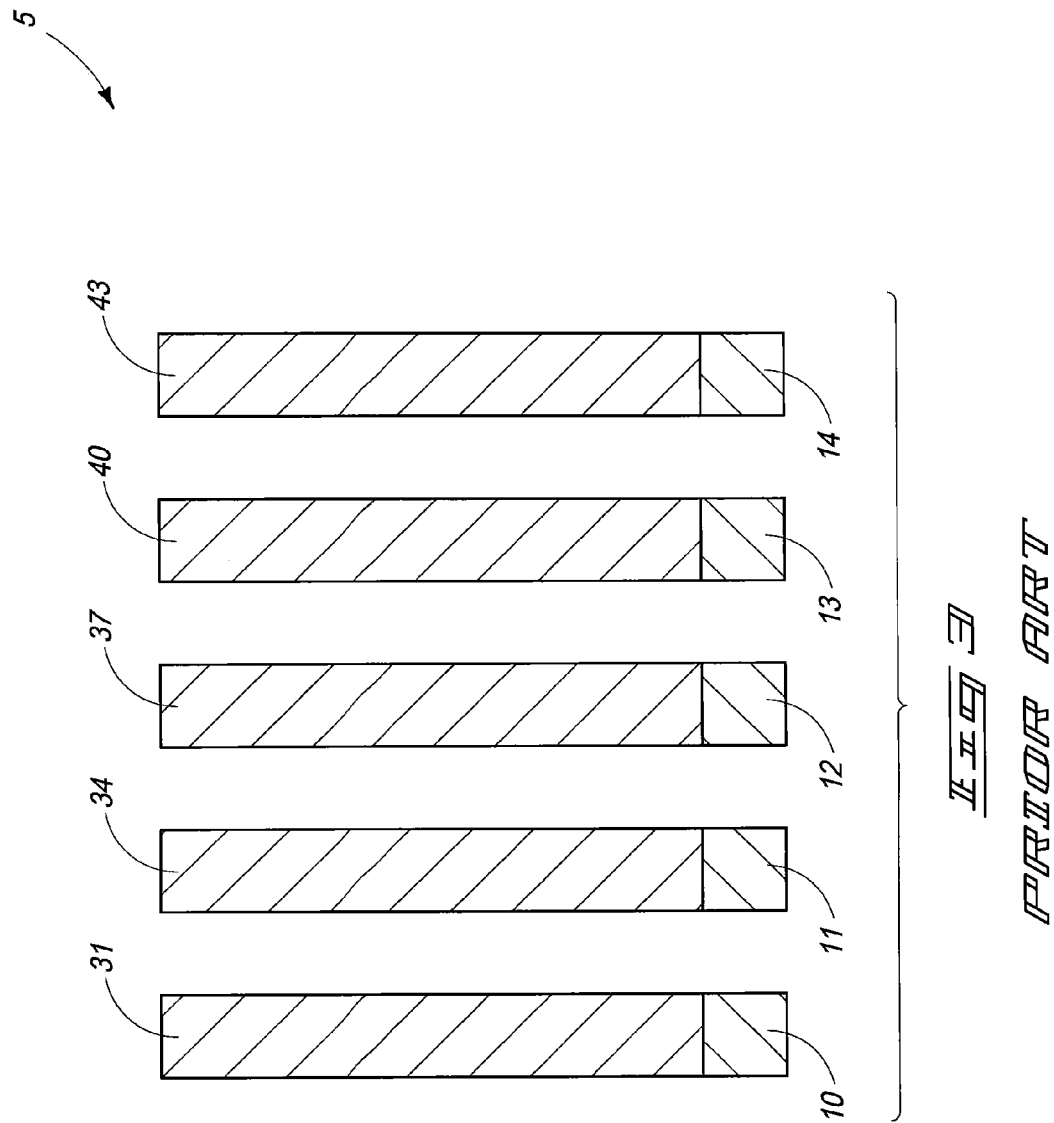

The utilization of multiple elevational levels for the global bitlines enables the memory units of the example embodiment memory array of FIGS. 4-6 to be more tightly packed than were the memory units of the prior art memory array described in FIGS. 1-3.

The top view of FIG. 4 shows a rectangular perimeter around one of the memory units of the example embodiment memory array. Such perimeter has two sides that are of dimension 2F, and two sides that are of dimension F. Accordingly the memory unit has an area along elevational plane 152 of about $2F^2$. The area is referred to as being "about $2F^2$," rather than as being absolutely $2F^2$ because the illustrated perimeter assumes that the memory cell material 45 and access device 46 are of negligible size. Since the memory cell material 45 and access device 46 have some physical dimension, the planar area of the memory unit cell will approach $2F^2$, but will not be $2F^2$ in an absolute mathematical sense. Alternatively, the planar area of each memory cell unit may be considered to be $2F^2$ if the memory cell material and access device are ignored; or in other words may be considered to be $2F^2$ relative to the wordlines, bitlines and spaces consumed by each memory cell unit.

FIG. 7 is a three-dimensional view of an example embodiment memory array analogous to that of FIGS. 4-6, which may assist the reader in visualizing such memory array. Identical number is utilized to label the components of FIG. 7 as was used to label the components of FIGS. 4-6. The locations of the wordlines 120-125 are indicated with arrows, but the wordlines are not shown in order to simplify the drawing.

The embodiment of FIG. 7 differs from that of FIGS. 4-6 in that the memory cell material 45 is contiguous around the vertical bitline pillars of FIG. 7, and is not contiguous around such vertical pillars in the embodiment of FIGS. 4-6. Accordingly, FIG. 7 shows a slightly different embodiment than FIGS. 4-6. The embodiment of FIG. 7 also shows the access devices 46 comprising material that is contiguous around the vertical bitline pillars. In yet other embodiments, the memory cell material may be contiguous around the vertical pillars, but the material of the access devices may be discontinuous around such pillars.

The embodiments of FIGS. 4-7 have access devices 46 adjacent memory cell material 45 in the individual memory cells 47 of the memory array. Thus, each memory cell unit comprises memory cell material and an access device. In other embodiments the access devices may be removed from the individual memory cell units to further reduce the size of the memory cell units. Specifically, the access devices may be placed in locations between the vertical pillars and the global bitlines, rather than being placed in the individual memory cell units. Accordingly, while the cross-section of FIG. 5 shows an embodiment in which the vertical bitline pillars 170-172 are ohmically connected to the global bitline 114, in other embodiments such vertical bitline pillars may be connected to the global bitline through access devices that respond non-linearly to increasing voltage (such as, for example, ovonic threshold switches). FIG. 8 shows a cross-sectional view analogous to that of FIG. 5, but shows an embodiment in which a memory array 100a has access devices 46 placed directly between the global bitline 114 and the vertical bitline pillars 170-172.

The embodiment of FIG. 8 advantageously reduces the size of the memory cells 47 by removing the access devices from such memory cells. In the embodiment of FIG. 8 the only material between the wordlines (for instance, 120-125) and the vertical bitline pillars (for instance, 170-172) is the memory cell material 45.

FIGS. 4-7 show embodiments in which all of the global bitlines are on the same side of the two-dimensional wordline array (specifically, the two dimensional array comprising the wordlines 120-125, 120a-125a and 120b-125b shown in FIG. 5). In other embodiments, some of the global bitlines may be on an opposite side of the wordline array relative to others of the global bitlines. FIG. 9 shows a three-dimensional view of a memory array 200 in which the some of the global bitlines are one side of a two-dimensional wordline array, and others of the global bitlines are on an opposing side of the wordline array. Identical numbering will be used to describe FIG. 9 as is utilized above for describing FIGS. 4-7. The wordlines 120-125, 120a-125a and 120b-125b are not all shown in FIG. 9 in order to simplify the drawing. Instead, only wordlines 121, 121a and 121b are shown, and the locations of wordlines 120, 122, 123, 124 and 125 are indicated with arrows.

The embodiment of FIG. 9 may be considered to have some of the global bitlines 110-118 formed at a different elevational level than others of the global bitlines. Specifically, the global bitlines include a first series containing bitlines 112, 114 and 116 that is formed at one elevational level (and specifically, below the wordlines in the shown embodiment), and a second series containing bitlines 111, 113, 115 and 117 that is formed at a different elevational level (and specifically, above the wordlines in the shown embodiment). The global bitlines of the first series alternate with those of the second series, as shown in FIG. 9.

In the embodiment of FIG. 9 the global bitlines of the first series are horizontally offset from the global bitlines of the second series, so that the global bitlines of the first series are not directly over the global bitlines of the second series. In other embodiments, the global bitlines of the first series may be directly over the global bitlines of the second series, as shown in FIG. 10 with reference to a memory array 300. The wordlines are not shown in FIG. 10 in order to simplify the drawing. However, locations of wordlines 120-125 are indicated with arrows.

The embodiments of FIGS. 9 and 10 may, like the embodiment of FIGS. 4-6, form an array in which the planar area of individual memory cell units is $2F^2$ relative to the wordlines, bitlines and spaces consumed by the individual memory cell units.

The access devices may be in the memory cells of the embodiments of FIGS. 9 and 10 as shown, or may be between the vertical bitline pillars and the global bitlines in other embodiments analogous to the embodiment of FIG. 8.

The combination of a global bitline and the vertical pillars attached thereto may be considered to form a structure analogous to a comb. In the embodiment of FIGS. 4-7, such combs may be considered to be within two series that are elevationally offset relative to one another; with one series comprising global bitlines 110, 112, 114, 116 and 118, and the other series comprising global bitlines 111, 113, 115 and 117. The combs of both series are parallel to one another and all have the vertical pillars extending in the same direction. In contrast, in the embodiments of FIGS. 9 and 10, one series of combs has the vertical pillars extending upwardly, while the other series of combs has the vertical pillars extending downwardly. For instance, the embodiment of FIG. 10 has global bitlines 111, 113, 115, and 117 within a first series of combs; and has global bitlines 112, 114, 116 and 118 within a second series of combs. The first series is exemplified by global bitline 118 and the vertical pillars 180, 181 and 182 attached thereto; while the second series is exemplified by the combination of global bitline 117 and the vertical pillars 178 and 179 attached thereto. The first series of combs has vertical pillars extending upwardly, and the second series has vertical pillars extending downwardly.

The memory arrays described herein may be incorporated into integrated circuitry, and thus may be supported by a semiconductor substrate in some applications. The memory arrays may be formed by any suitable processing.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

When an element as a layer, region or substrate is referred to as being "against" another element, it can be directly against the other element or intervening elements may also be present. In contrast, when an element is referred to as being "directly against" another element, there are no intervening elements present. When an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

The term "directly over" is used to indicate vertical alignment of structures, and is distinguished from the term "over"

which merely indicates that one structure is above another. Accordingly, a first structure is over a second structure if the first structure is above the second structure regardless of any lateral displacement that may exist between the first and second structures; and a first structure is "directly over" a second structure if the first structure is vertically aligned with the second structure.

If one or more substances are referred to as being "directly between" a pair of structures, the term "directly between" is used to indicate that the one or more substances are sandwiched within a gap between the two structures.

The embodiments discussed above may be utilized in electronic systems, such as, for example, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory array comprising a plurality of memory cell units; the array comprising multiple elevational levels of wordlines, and planes through each level; the areas of the individual memory cell units along the planes being less than $4F^2$ relative to wordlines, bitlines, and spaces consumed by the memory cell units.

2. The memory array of claim 1 wherein the areas of the individual memory cell units along the planes are $2F^2$ relative to wordlines, bitlines, and spaces consumed by the memory cell units.

3. The memory array of claim 1 wherein the memory cell units comprise phase change material, and are directly between wordlines and bitlines; and wherein the only material directly between the wordlines and bitlines is the phase change material.

4. The memory array of claim 1 comprising:
global bitlines extending along a first horizontal direction; the global bitlines comprising a first series at a first elevational level, and a second series at a second elevational level which is different from the first elevational level; the global bitlines of the first series alternating with the global bitlines of the second series;
vertical local bitlines extending perpendicularly to the global bitlines;
wordlines extending along a second horizontal direction which is perpendicular to the first horizontal direction; the wordlines being stacked in a two-dimensional array comprising vertical columns and horizontal rows; the vertical columns of the wordline array comprising two or more wordlines; the vertical local bitlines extending through the wordline array so that vertical local bitlines are between adjacent vertical columns of the wordline array; and
memory cell material between the wordlines and the vertical local bitlines; the memory cell material forming memory cells of the memory cell units, with individual memory cells being uniquely addressed by wordline/global bitline combinations.

5. The memory array of claim 4 wherein the global bitlines of the first series are on an opposite side of the wordlines as the global bitlines of the second series.

6. The memory array of claim 4 wherein the global bitlines of the first series are on a common side of the wordlines as the global bitlines of the second series.

7. The memory array of claim 4 wherein the global bitlines of the first series are on an opposite side of the wordlines as the global bitlines of the second series; wherein the memory cell material is the only material directly between the wordlines and the vertical local bitlines; and wherein the memory cell material is chalcogenide-containing phase change material.

8. The memory array of claim 4 wherein the memory cell material comprises chalcogenide-containing phase change material.

9. The memory array of claim 4 wherein the memory cell material comprises alloys of germanium, antimony and tellurium.

10. A memory array comprising:
a plurality of memory cell units comprising access devices other than transistors; and
multiple elevational levels of wordlines, and planes through each level; the areas of the individual memory cell units along the planes being less than $4F^2$ relative to wordlines, bitlines, access devices and spaces consumed by the memory cell units.

11. The memory array of claim 10 wherein the access devices comprise diodes.

12. The memory array of claim 10 wherein the access devices comprise ovonic threshold devices.

13. The memory array of claim 10 wherein the areas of the individual memory cell units along the planes are $2F^2$ relative to wordlines, bitlines, access devices and spaces consumed by the memory cell units.

14. The memory array of claim 10 wherein the memory cell units comprise phase change material, and are directly between wordlines and bitlines; and wherein the only material directly between the wordlines and bitlines is the phase change material.

* * * * *